United States Patent

Gardner et al.

[11] Patent Number: 6,087,238
[45] Date of Patent: Jul. 11, 2000

[54] SEMICONDUCTOR DEVICE HAVING REDUCED-WIDTH POLYSILICON GATE AND NON-OXIDIZING BARRIER LAYER AND METHOD OF MANUFACTURE THEREOF

[75] Inventors: Mark I. Gardner, Cedar Creek, Tex.; H. Jim Fulford, Austin, Tex.

[73] Assignee: Advanced Micro Devices, Inc., Sunnyvale, Calif.

[21] Appl. No.: 08/992,383

[22] Filed: Dec. 17, 1997

[51] Int. Cl.$^7$ .................................................. H01L 21/336
[52] U.S. Cl. .......................... 438/304; 438/585; 438/770
[58] Field of Search .................................. 438/302, 304, 438/585, 768, 769, 770; 257/324

[56] References Cited

U.S. PATENT DOCUMENTS 4,869,781  9/1989  Euen et al. .
5,476,802  12/1995  Yamazaki et al. ....................... 438/307
5,650,649  7/1997  Tsukiji ..................................... 257/316
5,858,843  1/1999  Doyle et al. .

OTHER PUBLICATIONS

U.S. application serial No. 08/924,455, filed Aug. 29, 1997.

*Primary Examiner*—John F. Niebling
*Assistant Examiner*—John Murphy

[57] ABSTRACT

A semiconductor device having a reduced polysilicon gate electrode width is provided along with a process for manufacturing such a device. In accordance with the present invention, a semiconductor device may be formed by forming an oxidation-resistant barrier layer over a substrate. At least one polysilicon block is formed over the barrier layer. A dopant is implanted through the barrier layer into the substrate. The polysilicon block is oxidized to grow an oxide layer on exposed surfaces and thereby reduce the width of the block. The oxide layer then can be removed to form a gate electrode having a reduced width. Plural implantations and oxidation-removal can be carried out as desired.

17 Claims, 3 Drawing Sheets

">6,087,238

SEMICONDUCTOR DEVICE HAVING REDUCED-WIDTH POLYSILICON GATE AND NON-OXIDIZING BARRIER LAYER AND METHOD OF MANUFACTURE THEREOF

FIELD OF THE INVENTION

The present invention is generally directed to semiconductor devices. More particularly, the invention is directed to a semiconductor device having a reduced polysilicon gate electrode width and a method of manufacturing such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicabilities and numerous disciplines. An example of such a silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal typically is applied via gate terminal (not shown). Heavily doped source region 103 and drain region 105 are formed in a semiconductor substrate 107, and respectively are connected to source and drain terminals (not shown).

A channel region 109 is formed in the semiconductor substrate 107 beneath the gate electrode 101 and separates the source region 103 and drain region 105. The channel typically is lightly doped with a dopant of a type opposite to that of the source and drain regions. The gate electrode 101 is physically separated from the semiconductor substrate 107 by a gate insulating layer 111. Typically, this insulating layer is an oxide layer such as $SiO_2$. The insulating layer 111 is provided to prevent current from flowing between the gate electrode 101 and the semiconductor source region 103, drain region 105, or channel region 109.

In operation, an output voltage typically is developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner, an electric field controls the current flow through the channel region 109. This type of device commonly is referred to as a MOS field-effect-transistor (MOSFET). Semiconductor devices such as the one described are used in large numbers to construct most modern electronic devices. In order to increase the capability of such electronic devices, it is necessary to integrate ever larger numbers of such devices into a single silicon wafer. As the semiconductor devices are scaled down in order to form a larger number of such devices on a given surface area, the structure of the devices and fabrication techniques used to make the devices must be altered.

One important step in the manufacture of MOS devices is the fabrication of the gate electrode. The gate electrode typically is formed by depositing a layer of polysilicon. Portions of the polysilicon layer are removed selectively, for example, using well-known photolithography and etching techniques. However, these conventional techniques for forming gate electrodes impose limitations on the minimum width of the gate electrode. The resolution of the photolithography process, in particular, imposes limitations on the minimum width of the gate electrode. As these thresholds for minimum width are reached, the ability to further scale down the semiconductor devices is hindered.

SUMMARY OF THE INVENTION

The present invention relates to a method of producing a semiconductor device having a reduced polysilicon gate electrode width. In the present invention, a semiconductor device is formed by forming a non-oxidizing barrier layer, such as a nitride layer, over a substrate. At least one polysilicon block is formed over the barrier layer. A dopant is implanted into an active region of the substrate through the barrier layer. The polysilicon block is oxidized, with the barrier layer resisting oxidation. At least part of the oxidized portion of the polysilicon block can be removed to reduce the width of the gate electrode.

Additional steps of implanting dopant into the substrate through the barrier layer and removal of oxidized portions of the polysilicon block can be carried out if desired. This provides flexibility in the selection of doping regimens, for example to provide various types of source/drain regions.

A semiconductor device in accordance with the embodiment of the present invention includes a substrate and a barrier layer over the substrate. At least one polysilicon gate electrode is disposed over the barrier layer. In accordance with one aspect of the present invention, the polysilicon gate has a width of about 1000 angstroms or less, preferably 300–500 angstroms.

The summary of the present invention is not intended to describe each illustrated embodiment or every implementation of the present invention. The figures and detailed description that follow describe the embodiments more particularly.

BRIEF DESCRIPTION OF THE DRAWINGS

The present invention may be understood more completely in consideration of the following detailed description of the various embodiments of the invention in connection with the accompanying drawings, in which.

Figure 1:
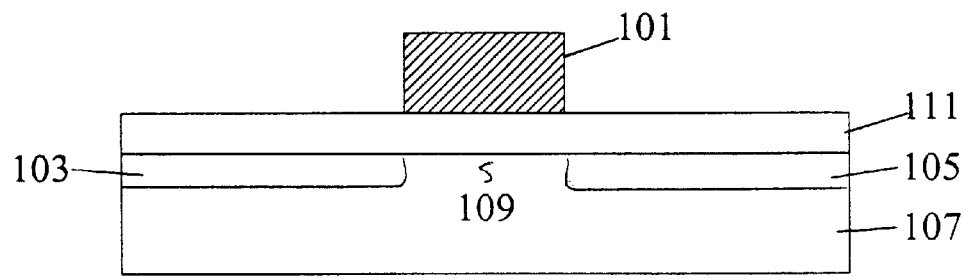
FIG. 1 illustrates the components of a typical MOS semiconductor device.

The invention is amenable to various modifications and alternative forms, and the specifics of the present invention have been shown only by way of example in the drawings, and will be described in detail. It should be understood that the intention is not to limit the invention to the particular embodiments described. On the contrary, the intention is to cover all modifications, equivalents and alternatives following the spirit and scope of the invention as defined by the appended claims.

DETAILED DESCRIPTION OF THE PREFERRED EMBODIMENT

The disclosure of co-pending application Ser. No. 08/924,455, entitled Semiconductor Device Having Reduced Polysilicon Gate Electrode Width And Method Of Manufacture Thereof, is incorporated herein by reference.

The present invention is applicable to a variety of semiconductor devices making use of a polysilicon gate electrode, and in particular in applications where a polysilicon gate electrode is formed in a MOS device, such as an NMOS, PMOS, CMOS or BiCMOS device. While the present invention is not so limited, an understanding of the various aspects of the invention is best gained through a discussion of various application examples of the processes used to form such semiconductor devices.

Figure 2A:
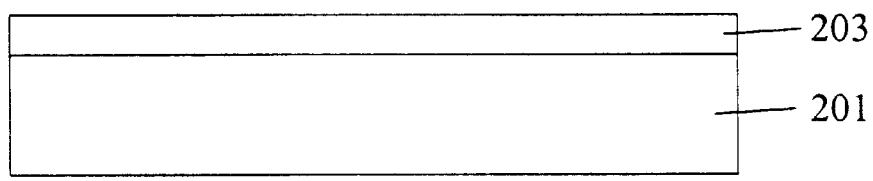
FIGS. 2A–2H illustrate a fabrication process in accordance with an exemplary embodiment of the present invention.

Referring to FIGS. 2A–H, an example of a process for forming a semiconductor device in accordance with the present invention will be described. As seen in FIG. 2A, a barrier layer 203 is formed on a substrate 201. The substrate 201 is preferably a silicon substrate. Such substrates are well-known in the art. Barrier layer 203 will function as a gate insulating layer, insulating the later-formed gate electrode from the surface of the substrate.

The barrier layer 203 also is resistant to oxidation and serves to protect the surface of the substrate from oxidation steps discussed below. The barrier layer may be formed from a number of different materials, including a nitride such as silicon nitride for example. A silicon nitride barrier layer 203 can be formed using, for example, known deposition techniques, such as jet nitride deposition, sputtered nitride deposition and plasma deposition.

The thickness of the barrier layer 203 is selected to insulate the substrate sufficiently from oxidation and to provide adequate gate insulating layer characteristics. Suitable thicknesses for a silicon nitride barrier layer 203 range from about 5–30 angstroms for many applications. Advantageously, silicon nitride has a dielectric constant (k) of about 8. Accordingly, 5–30 angstroms of silicon nitride would be equivalent to about 2.5–15 angstroms of $SiO_2$, which has a (k) of about 4. If desired, the barrier layer 203 initially can be formed in a thickness greater than the final desired thickness, and then reduced to the desired thickness by etching or other suitable removal techniques. The formation of the thicker layer initially can provide a layer having more desirable characteristics such as increased uniformity.

The barrier layer 203 may be formed directly on the surface of substrate 201. It is recognized, however, that a native oxide layer may be present on the surface of the substrate.

Figure 2B:
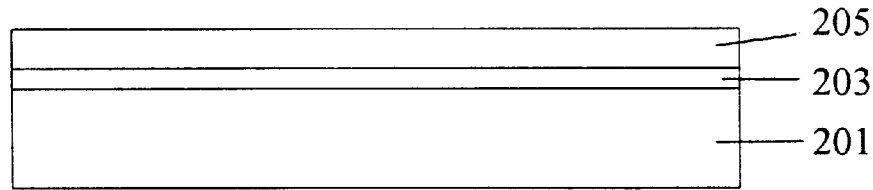

After the barrier layer 203 is formed, polysilicon layer 205 is formed over the barrier layer 203, as shown in FIG. 2B. The polysilicon layer may be formed, for example, using well-known deposition techniques. The initial thickness of the polysilicon layer is determined taking into account the fact that a certain amount of the polysilicon will be removed in subsequent steps as discussed below. Typically, the desired final thickness of the polysilicon layer will be in the range of 750–2,000 angstroms, more typically 750–1,500 angstroms, and even more typically 750–1,000 angstroms. In order to provide suitable final thicknesses, the initial thicknesses generally will be in the range of 2,000–3,000 angstroms.

Figure 2C:
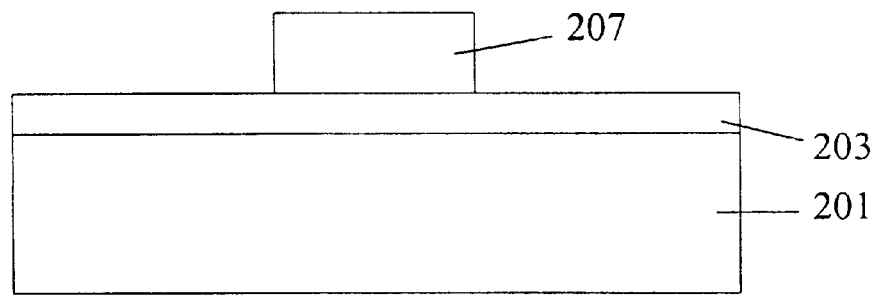

As seen in FIG. 2C, portions of the polysilicon layer 205 then are removed to form one or more polysilicon blocks 207. The polysilicon block 207 will be used to form a gate electrode. While only one such block is illustrated in the Figure, it will be understood that a number of such blocks usually will be present, depending on the desired number and location of the gate electrodes in the final device. The polysilicon block 207 may be formed using, for example, well-known photolithograph and etching techniques. These techniques typically involve the formation of a photoresist layer over the polysilicon layer 205, followed by developing of the photoresist layer to form openings therein. Portions of the polysilicon layer 205 then can be removed to form the polysilicon blocks 207. As noted above, the minimum width of the polysilicon blocks 207 is limited by the resolution of the photolithography or etching equipment used. For example, at present the minimum resolution of such equipment, and thus the minimum width of the polysilicon block 207, is on the order of about 0.15 μm. The present invention provides a methodology for reducing the width of the polysilicon block 207 below the minimum resolution of the photolithograph equipment employed. Moreover, as further reductions in the minimum resolutions of techniques for forming the polysilicon blocks take place, the present invention will be equally applicable for further reducing the width of the polysilicon blocks that can be formed by such techniques.

Figure 2D:
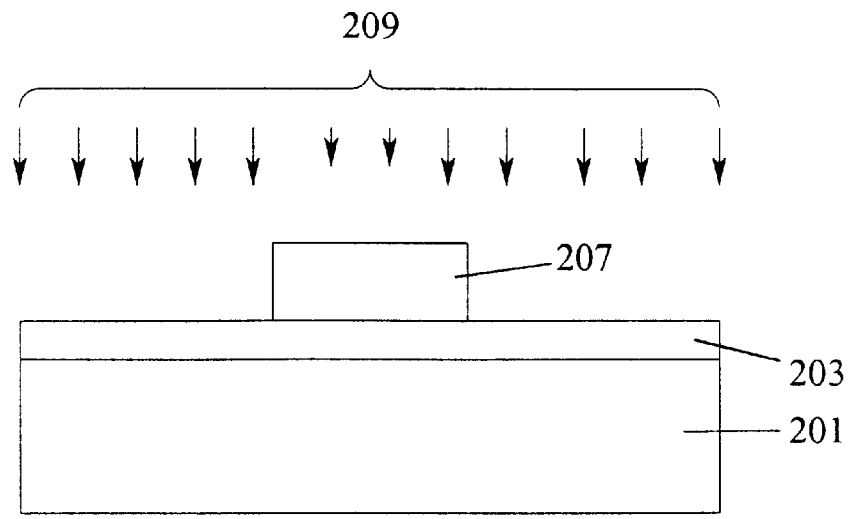

After the polysilicon block 207 has been formed, a first dopant 209 is implanted into an active region of the substrate 201 through the barrier layer 203. This is illustrated in FIG. 2D. The polysilicon block 207 may be protected from the implanting of the first dopant or not, as desired. Possible options for the first dopant 209 will be discussed below.

Figure 2E:
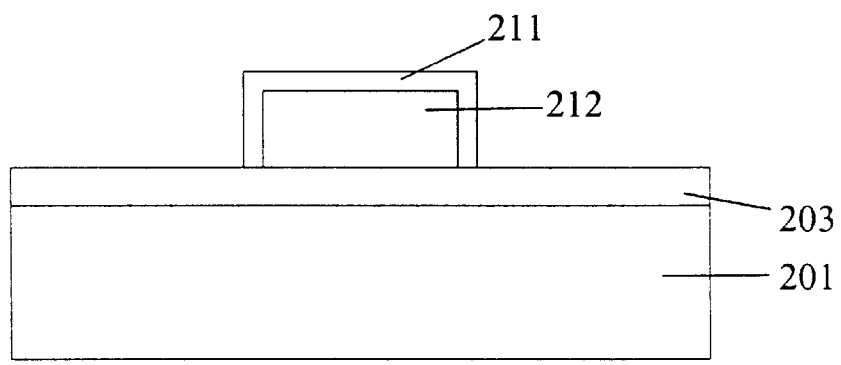

The polysilicon block 207 can be oxidized in an oxygen-containing atmosphere, for example, an $O_2$ and/or $H_2O$ ambient. This oxidation generally forms an oxide layer 211 on exposed surfaces of the polysilicon block 207. The formation of oxide is illustrated in FIG. 2E. The oxidation may be carried out by any of a number of different known oxidation techniques, including, for example, exposure to an oxygen-containing atmosphere at temperatures of about 700–1,050° C., more typically 800–1,050° C. The oxidation also can function as an annealing step for the implanted first dopant, if desired, and thus the oxidation could take the form of a tube annealing process carried out at a temperature in the range discussed above, for a time of about 10–60 minutes.

Generally, the ratio of oxide growth to polysilicon consumption will be approximately 2:1, although this can vary with the processing conditions employed. That is, one unit of polysilicon is consumed for every two units of oxide that are formed. Thus, the thickness of the oxidized portion will be selected suitably in consideration of the desired final thickness of the polysilicon block 207.

By way of example, the width of polysilicon block 207 may be reduced by one-third, one-half, or even two-thirds. Thus, if the initial width of the polysilicon block 207 is 0.15 μm, the width can be reduced to 0.10 μm, i.e., by one-third, by growing a 500-angstrom thick oxidized portion 211. If the entire oxidized portion is removed, this will reduce the width of the polysilicon block 207 by 250 angstroms, i.e., 0.025 μm, on each side. This would provide an overall width reduction of 500 angstroms (0.05 μm). Similarly, the 0.15 μm block 207 could be reduced to 0.05 μm by growing an oxidized portion 211 of 1,000 angstroms thickness on each side of the polysilicon block. The present invention is not limited to the particular width reductions illustrated above, and the width of the block 207 may be reduced by less than one-third or more than two-thirds, as desired.

The oxide layer 211 may be removed, leaving behind a remaining portion 212. The oxidized portion 211 can be removed using known oxide etchants such as plasma-chemistry etchants and wet etchants. Typically, the etchants used are selective to the barrier layer 203, so as not to affect the barrier layer 203 significantly. The oxidized portions may be removed, for example, using a 10:1 hydrofluoric acid etchant. As discussed below, it may be desirable in some cases to remove only part of the oxidized portion 211.

Figure 2F:
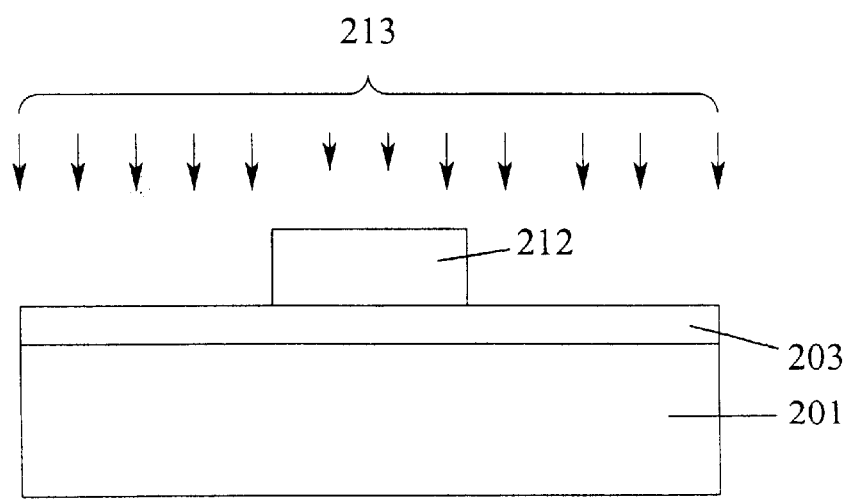

If desired, a second implanting procedure can be carried out after removal of the oxidized portion 211. This also is illustrated in FIG. 2F.

Figure 2G:
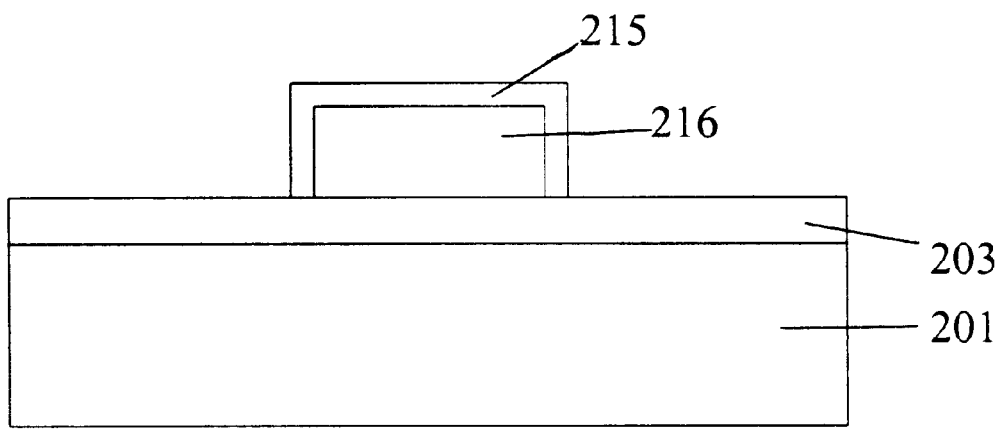
Figure 2H:
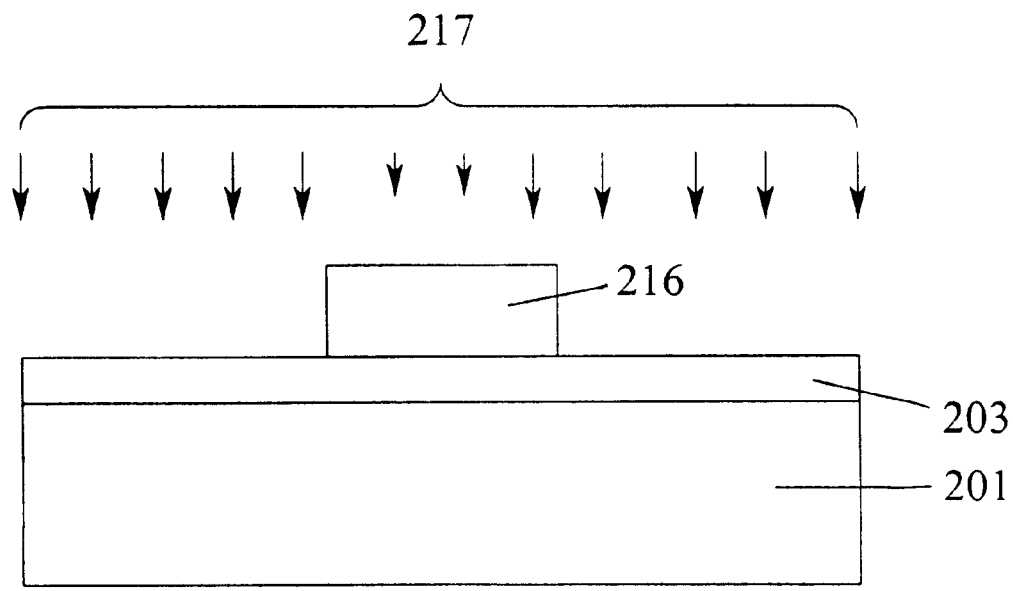

As illustrated in FIG. 2G, the remaining portion 212 likewise can be subjected to an oxidation process in order to accomplish further removal of part of the silicon block 207. This would result in a second oxidized portion 215, which could be removed to leave a second remaining block 216. This is illustrated in FIG. 2H. A third dopant 217 then can be implanted if desired. Fabrication may continue with further processes such as spacer formation, source/drain implants, silicidation, and contact formation to form the final structure.

Variations in the process described above are possible, such as implanting before or after the various oxidation steps. For example, it would be possible to carry out the implanting of the second dopant 213 prior to the removal of the oxidized portion 211 if desired. In addition, as with the second implanting, the third dopant 217 could be implanted before removal of the second oxidized portion 215. As an example of a further alternative, the second oxidized portion 215 could be formed through an incomplete removal of the oxidized portion 211 instead of the complete removal and re-oxidation. This option further could be combined with additional oxidation if desired.

Examples of different doping techniques now will be discussed. It should be understood that these doping techniques will be carried out with the customary masking to protect various portions of the device from undesired implanting as needed, such as PMOS and NMOS masking during the formation of a CMOS device.

One option for the implanting of the first dopant 209 would be to carry out a heavy dose implanting with no subsequent dopant. In this case, it would be possible to rely on diffusion from the heavy dose implant to form a low-density doped region in the area covered by the portion of polysilicon block 207 that is subsequently oxidized and removed. Alternatively, it would be possible to carry out both the heavy dose implant and a light dose implant prior to the oxidation and removal of the portion of the polysilicon block. In this case, the oxidation and removal can be considered as creating a potential spacer for future silicidation.

Alternatively, the oxidation and removal steps can be used as part of a dopant gradient profile. That is, the first and second dopant implantations, and optionally the third dopant implantation, can be carried out in decreasing concentrations. In this way, the highest concentration dopant is farthest away from the channel to increase reliability. For example, the first dopant 209 could be the heavy dose implant. Following oxidation and removal of the oxidized portion 211, a moderate-dose implant could be carried out for the second dopant 213, for example, on the order of 5E14-1E15 atoms/cm$^2$. This could be followed by the further oxidation and removal of the second oxidized portion 215, followed by a final low-dose implant for the third dopant 217, for example on the order of 1E13-1E14 atoms/cm$^2$, to form a LDD region. In this example, it also is possible to change the dopant, for example, to use larger dopant atoms for the later implantations. When boron or a boron compound is used for the doping agent, the use of a nitride barrier layer 203 is beneficial in that the nitride will help prevent the dopant from passing out of the substrate to the oxidized portion of the polysilicon block 207.

The illustrated embodiment shows one exemplary manner for integrating a doping scheme with the formation of reduced width gate electrodes. The invention is not so limited, and other doping schemes may be employed. By way of example, in addition to the alternatives already discussed, it would be possible to make use of the increase in block size resulting from the oxidation of the polysilicon block. For instance, a low- or moderate-dose implanting could be carried out before an oxidation step, with a heavier dose implanting being carried out after the oxidation step. Since the oxidation will increase the size of the polysilicon block (until the oxidized portion is removed), this will result in the spacing of the heavy dose implanting away from the channel region.

By use of suitable masking, it is possible to provide different channel lengths and dopant characteristics at different places on the same substrate. For example, N-channels could be of a different length than P-channels. The formation of lightly-doped drain regions may be performed using known dosages, implant energies and implant techniques.

The present invention permits the production of semiconductor devices having polysilicon gate electrodes with minimum widths. The use of the non-oxidizing barrier layer permits flexibility in the selection of various doping strategies. The oxidation and removal of a portion of the polysilicon block permit the width of the gate electrode to reduced below the minimum resolution of the photolithography or etching equipment employed. This permits further scaling down of device dimensions with corresponding increases in performance such as reduced channel lengths and faster performance.

As noted above, the present invention is applicable to the fabrication of a variety of different devices where the advantages of reduced-width gate electrodes are desired. Accordingly, the present invention is not limited to the particular examples described above, but rather should be understood to cover all aspects of the invention as fairly set forth in the attached claims. Various modifications, equivalent processes, and other structures to which the present invention may be applicable will be readily apparent to those of skill in the art upon review of the present specification. The claims are intended to cover such modifications and devices.

We claim:

1. A method of forming a gate electrode of a semiconductor device, comprising:

forming a nitride barrier layer over a substrate;

forming a polysilicon layer over the nitride barrier layer;

removing a portion of the polysilicon layer to form at least one polysilicon block;

implanting a first dopant through the nitride barrier layer and into an active region of the substrate adjacent a polysilicon block;

oxidizing the polysilicon block;

removing at least part of the oxidized portion of the polysilicon block to form the gate electrode and then reoxidizing the polysilicon block; and after reoxidizing the polysilicon block, implanting a dopant into the substrate and forming a portion of the substrate having concentrations of dopant that increases with successive implantations.

2. The method of claim 1, wherein the barrier layer is a nitride layer.

3. The method of claim 1, wherein the substrate is heated at a temperature of about 700–1,050° C. in an oxygen-based atmosphere to oxide the polysilicon block.

4. The method of claim 1, wherein the implanting the first dopant forms a heavily-doped region in the substrate.

5. The method of claim 4, further comprising implanting a lightly-doped region of the substrate prior to oxidizing the polysilicon block.

6. The method of claim 1, further comprising implanting a second dopant after oxidizing the polysilicon block.

7. The method of claim 6, wherein the second implanting is carried out before the removal of the oxidized portion of the silicon block.

8. The method of claim 6, wherein the second implanting is carried out after the removal of the oxidized portion of the polysilicon block.

9. The method of claim 1, further comprising again reoxidizing the polysilicon block after removing the first oxidized portion of the polysilicon block and removing at least part of the resulting second oxidized portion of the polysilicon block.

10. The method of claim 9, further comprising again implanting a dopant through the nitride barrier layer and into the substrate after again reoxidizing the polysilicon block.

11. The method of claim 1, wherein the polysilicon block has a final width in the range of about 300–500 angstroms.

12. The method of claim 1, wherein the polysilicon layer has a thickness in the range of about 2,000–3,000 angstroms.

13. The method of claim 12, wherein the polysilicon block has a final thickness in the range of about 750–1,500 angstroms.

14. A method of forming a gate electrode of a semiconductor device, comprising:

forming a nitride barrier layer over a substrate;

forming a polysilicon layer over the nitride barrier layer;

removing a portion of the polysilicon layer to form at least one polysilicon block;

implanting a first dopant through the nitride barrier layer and into an active region of the substrate adjacent a polysilicon block;

oxidizing the polysilicon block;

removing at least part of the oxidized portion of the polysilicon block to form the gate electrode;

reoxidizing the polysilicon block after removing the first oxidized part of the polysilicon block, and removing at least part of the resulting second oxidized portion of the polysilicon block; and implanting a dopant through the nitride layer and into the substrate after reoxidizing the polysilicon block, wherein the concentration of dopant implanted increases with successive implantations.

15. The method of claim 14, wherein the polysilicon block has a final width of 30–50 angstroms.

16. The method of claim 14, wherein the polysilicon layer has a thickness of about 2,000–3,000 angstroms.

17. The method of claim 16, wherein the polysilicon block has a final thickness of about 750–1,500 angstroms.

* * * * *